US012660138B2

(12) United States Patent
Joardar et al.

(10) Patent No.: US 12,660,138 B2
(45) Date of Patent: Jun. 16, 2026

(54) COOLING SYSTEM FOR POWER ELECTRONICS

(71) Applicant: Carrier Corporation, Palm Beach Gardens, FL (US)

(72) Inventors: Arindom Joardar, Jamesville, NY (US); Tobias Sienel, Baldwinsville, NY (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 196 days.

(21) Appl. No.: 18/405,259

(22) Filed: Jan. 5, 2024

(65) Prior Publication Data

US 2024/0237313 A1 Jul. 11, 2024

Related U.S. Application Data

(60) Provisional application No. 63/479,110, filed on Jan. 9, 2023.

(51) Int. Cl.
*H05K 7/20* (2006.01)

(52) U.S. Cl.
CPC ..... *H05K 7/20936* (2013.01); *H05K 7/20318* (2013.01); *H05K 7/20327* (2013.01); *H05K 7/209* (2013.01); *H05K 7/20945* (2013.01)

(58) Field of Classification Search
CPC .......... H05K 7/20936; H05K 7/20318; H05K 7/20327; H05K 7/209; H05K 7/20945
USPC ........................................................ 361/701
See application file for complete search history.

(56) References Cited

U.S. PATENT DOCUMENTS

| | | | |
|---|---|---|---|
| 4,186,422 A | 1/1980 | Laermer | |
| 4,536,824 A | 8/1985 | Barrett et al. | |
| 5,274,530 A | 12/1993 | Anderson | |
| 5,482,113 A * | 1/1996 | Agonafer | F28B 1/06 |
| | | | 165/157 |
| 6,609,561 B2 | 8/2003 | Sauciuc et al. | |
| 6,926,070 B2 * | 8/2005 | Jenkins | H01L 23/473 |
| | | | 165/905 |
| 7,123,479 B2 | 10/2006 | Chang et al. | |
| 7,342,785 B2 | 3/2008 | Liu | |
| 8,091,614 B2 | 1/2012 | Martin et al. | |
| 9,179,574 B2 * | 11/2015 | Canney | F25B 25/005 |
| 9,201,474 B2 | 12/2015 | Campbell et al. | |
| 9,436,235 B2 | 9/2016 | Damaraju et al. | |

(Continued)

FOREIGN PATENT DOCUMENTS

| CN | 112492841 A | 3/2021 |
|---|---|---|
| WO | 2020025717 A1 | 2/2020 |

OTHER PUBLICATIONS

Extended European Search report for European Application No. 24150882.9; Report Mail Date Jun. 12, 2024 (9 Pages).

*Primary Examiner* — Zhengfu J Feng
(74) *Attorney, Agent, or Firm* — CANTOR COLBURN LLP

(57) ABSTRACT

A cooling system for cooling one or more heat-generating devices includes a heat sink to which the one or more heat-generating devices are thermally coupled and a heat exchanger thermally coupled to the heat sink. The heat exchanger has a first flow path for receiving a primary cooling fluid and a second flow path for receiving a secondary cooling fluid. Heat is transferable to the primary cooling fluid from both the heat sink and the secondary cooling fluid at the heat exchanger.

20 Claims, 6 Drawing Sheets

(56)     References Cited

U.S. PATENT DOCUMENTS

| | | | |
|---|---|---|---|
| 10,349,561 | B2 | 7/2019 | Farshchian et al. |
| 10,356,949 | B2 | 7/2019 | Pan et al. |
| 10,548,239 | B1 | 1/2020 | Iyengar et al. |
| 10,548,240 | B1 | 1/2020 | Iyengar et al. |
| 10,681,846 | B2 | 6/2020 | Iyengar et al. |
| 10,966,352 | B2 | 3/2021 | Iyengar et al. |
| 11,044,835 | B2 | 6/2021 | Chiu et al. |
| 11,106,255 | B2 | 8/2021 | Watanabe |
| 11,109,517 | B2 | 8/2021 | Farshchian et al. |
| 11,119,543 | B2 | 9/2021 | Thakar et al. |
| 11,175,102 | B1 | 11/2021 | Harrington et al. |
| 11,291,136 | B2 | 3/2022 | Qu et al. |
| 11,382,241 | B2 | 7/2022 | Gao |
| 2002/0056908 | A1 | 5/2002 | Brownell et al. |
| 2007/0121295 | A1 | 5/2007 | Campbell et al. |
| 2007/0125523 | A1 | 6/2007 | Bhatti et al. |
| 2009/0027856 | A1 | 1/2009 | Mccoy |
| 2009/0308081 | A1* | 12/2009 | Ouyang .................. H01L 23/38 62/3.2 |
| 2010/0032150 | A1 | 2/2010 | Determan et al. |
| 2012/0090816 | A1 | 4/2012 | Bayazitoglu et al. |
| 2014/0355212 | A1 | 12/2014 | Campbell et al. |
| 2020/0375070 | A1 | 11/2020 | Grosskreuz et al. |
| 2021/0127529 | A1* | 4/2021 | Hanna ............... H05K 7/20772 |
| 2021/0247822 | A1 | 8/2021 | Gao |
| 2022/0039296 | A1 | 2/2022 | Dupont |
| 2022/0173015 | A1 | 6/2022 | Subrahmanyam et al. |
| 2022/0248565 | A1 | 8/2022 | Gao |

* cited by examiner

COOLING SYSTEM FOR POWER ELECTRONICS

CROSS-REFERENCE TO RELATED APPLICATIONS

This Application claims the benefit of United States Provisional Application No. 63/479,110, filed Jan. 9, 2023, the contents of which are incorporated by reference herein in their entirety.

BACKGROUND

Exemplary embodiments pertain to the art of heat exchangers, and more particularly to heat exchangers for cooling power electronics.

Power electronics devices such as motor drives generate waste heat during operation of the device. Additionally, when the power electronics devices heat up, the operational efficiency of the devices can degrade adding to the amount of heat generated. When utilized in a refrigeration system to drive, for example, a compressor of the refrigeration system, effective thermal integration of these devices can be important aspect to the system's overall efficiency and reliability. Consequently, a goal of the system integrator is to maintain these components within a range of operating temperatures which will maximize the system efficiency. Accordingly, there remains a need in the art for heat exchangers configured to closely integrate with power electronic devices which can maintain optimal temperatures for these components under a variety of load conditions.

BRIEF DESCRIPTION

According to an embodiment, a cooling system for cooling one or more heat-generating devices includes a heat sink to which the one or more heat-generating devices are thermally coupled and a heat exchanger thermally coupled to the heat sink. The heat exchanger has a first flow path for receiving a primary cooling fluid and a second flow path for receiving a secondary cooling fluid. Heat is transferable to the primary cooling fluid from both the heat sink and the secondary cooling fluid at the heat exchanger.

In addition to one or more of the features described herein, or as an alternative, further embodiments may include a movement mechanism operable to move the secondary cooling fluid through the second flow path.

In addition to one or more of the features described herein, or as an alternative, further embodiments may include that the movement mechanism includes a fan associated with a condenser of a refrigeration system.

In addition to one or more of the features described herein, or as an alternative, further embodiments may include that the heat exchanger includes an inlet manifold, the inlet manifold being positioned adjacent to the heat sink.

In addition to one or more of the features described herein, or as an alternative, further embodiments may include that a surface of the inlet manifold has a microstructure. The microstructure is optimized to facilitate boiling of the primary cooling fluid within the inlet manifold.

In addition to one or more of the features described herein, or as an alternative, further embodiments may include that the heat exchanger is a microchannel heat exchanger.

In addition to one or more of the features described herein, or as an alternative, further embodiments may include that the heat sink further includes a housing and a fluid circuit formed in the housing and through which a heat transfer fluid circulates.

In addition to one or more of the features described herein, or as an alternative, further embodiments may include that the heat transfer fluid is different than at least one of the primary cooling fluid and the secondary cooling fluid.

In addition to one or more of the features described herein, or as an alternative, further embodiments may include that at least one of the heat transfer fluid and the primary cooling fluid is a refrigeration fluid diverted from a condenser of a refrigeration system.

In addition to one or more of the features described herein, or as an alternative, further embodiments may include at least one valve operable to actively control a flow of the primary cooling fluid provided to the heat exchanger based on a thermal load at the heat exchanger.

In addition to one or more of the features described herein, or as an alternative, further embodiments may include at least one sensor for monitoring the thermal load at the heat exchanger.

In addition to one or more of the features described herein, or as an alternative, further embodiments may include that the at least one sensor is operable to monitor at least one of a temperature of the primary cooling fluid at an outlet of the heat exchanger and the temperature of the heat sink.

In addition to one or more of the features described herein, or as an alternative, further embodiments may include that the at least one valve is operable to actively control a flow of the primary cooling fluid to prevent condensation from forming at an exterior of the heat exchanger.

According to an embodiment, a method of cooling at least one heat-generating device includes transferring heat from a heat sink to a primary cooling fluid at a heat exchanger and transferring heat from a secondary cooling fluid to the primary cooling fluid at the heat exchanger. The heat exchanger is mounted to the heat sink.

In addition to one or more of the features described herein, or as an alternative, further embodiments may include transferring heat from the at least one heat-generating device to the heat sink.

In addition to one or more of the features described herein, or as an alternative, further embodiments may include that the heat exchanger includes an inlet manifold mounted adjacent to the heat sink and that transferring heat from the heat sink to the primary cooling fluid at the heat exchanger further includes transferring heat from the heat sink to the primary cooling fluid within the inlet manifold.

In addition to one or more of the features described herein, or as an alternative, further embodiments may include providing the secondary cooling fluid to the heat exchanger via a movement mechanism.

In addition to one or more of the features described herein, or as an alternative, further embodiments may include that the movement mechanism includes a fan associated with a condenser of a refrigeration system.

In addition to one or more of the features described herein, or as an alternative, further embodiments may include actively controlling a flow of the primary cooling fluid provided to the heat exchanger based on a thermal load at the heat exchanger.

In addition to one or more of the features described herein, or as an alternative, further embodiments may include determining the thermal load at the heat exchanger using information collected by one or more sensors.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
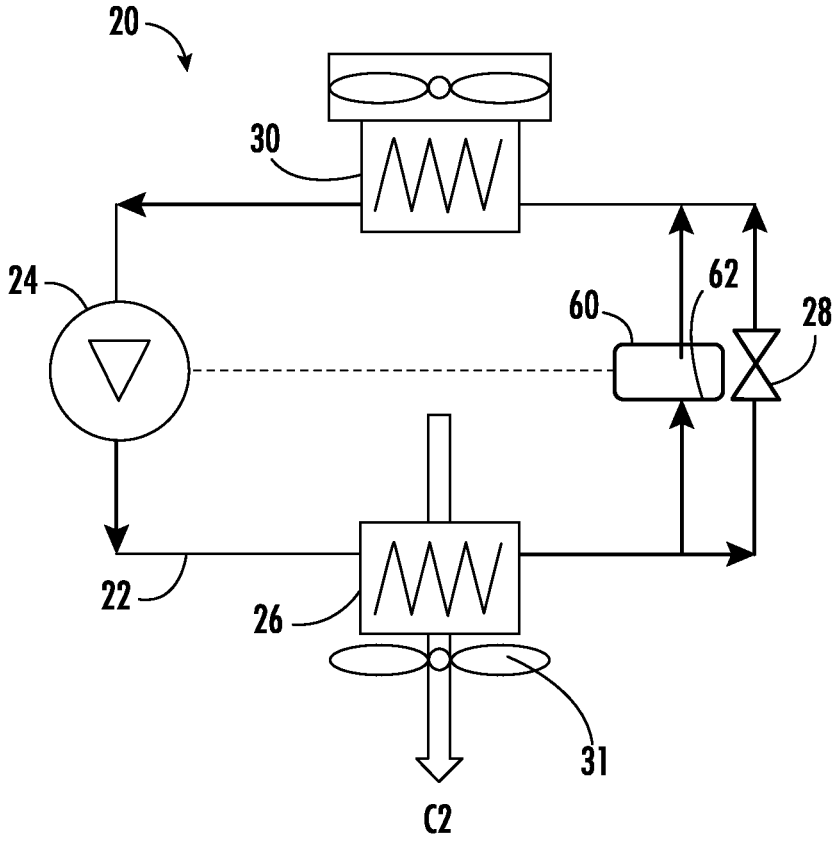
FIG. 1 is a schematic diagram of an example of a refrigeration system according to an embodiment.

Referring to FIG. 1, an example of a refrigeration system, such as a heating, ventilation, air conditioning and refrigeration (HVAC) system 20 is schematically illustrated. Exemplary refrigeration systems 20 include, but are not limited to, residential, split, packaged, chiller, rooftop, supermarket, transport and fuel cell systems, for example. In the illustrated, non-limiting embodiment, the refrigeration system 20 includes a refrigeration circuit 22 including a compressor 24, a condenser 26, an expansion device 28 and an evaporator 30 arranged in series and having a volume of refrigeration fluid, such as refrigerant for example, flowing therethrough.

Figure 2:
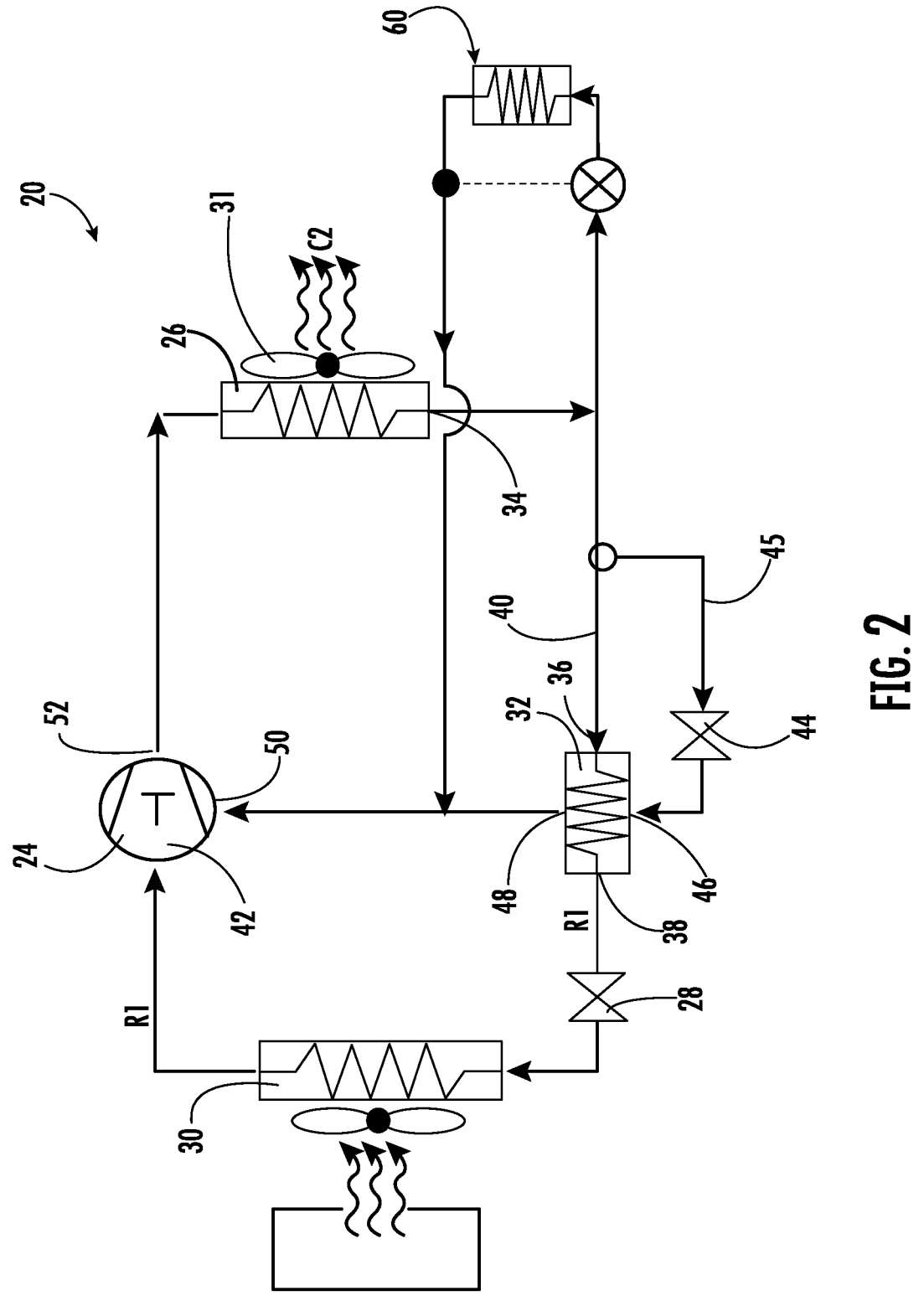
FIG. 2 is a schematic diagram of another example of a heating, ventilation, air conditioning and refrigeration (HVAC&R) system according to an embodiment.

Another example of a refrigeration system 20 is illustrated in FIG. 2. In addition to the compressor 24, condenser 26, expansion device 28, and evaporator 30 previously described the refrigeration circuit 22 includes an economizer heat exchanger 32. The economizer heat exchanger 32 may be positioned between the condenser 26 and the expansion device 28 relative to a flow of refrigeration fluid through the refrigeration circuit 22. Although the economizer heat exchanger 32 is illustrated as being located directly downstream from the outlet 34 of the condenser 26, it should be understood that embodiments where one or more other components of the refrigeration system 20 are located between the condenser 26 and an inlet of the economizer heat exchanger 32 are also contemplated herein.

In an embodiment, the economizer heat exchanger 32 is a brazed plated fin heat exchanger. However, other suitable types of heat exchangers are also within the scope of the disclosure. Further, the economizer heat exchanger 32 is a refrigeration fluid-refrigeration fluid heat exchanger and therefore has a plurality of distinct fluid flow paths formed therein. In the illustrated, non-limiting embodiment, the economizer heat exchanger 32 has a first flow path and a second flow path, respectively.

In the illustrated, non-limiting embodiment, the inlet 36 of the first flow path of the economizer heat exchanger 32, also referred to herein as the "main flow path," is arranged in direct fluid communication with an outlet 34 of the condenser 26. Alternatively, or in addition, the outlet 38 of the main flow path of the economizer heat exchanger 32 may be arranged directly upstream from and in fluid communication with an inlet of the expansion device 28.

In operation, a first portion R1 of the refrigeration fluid output from the condenser 26 is provided to the main flow path of the economizer heat exchanger 32 via a main conduit 40. Although the main flow path is illustrated as a single pass through the economizer heat exchanger 32, it should be understood that in other embodiments the main flow path may include a plurality of passes through the economizer heat exchanger 32. At the outlet 38 of the main flow path of the economizer heat exchanger 32, the first portion R1 of the refrigeration fluid is configured to flow to the expansion device 28. From the expansion device 28, the refrigeration fluid is expanded within the evaporator 30. The first portion R1 of refrigeration fluid output from the evaporator 30 is provided via a first compressor inlet path to a primary suction inlet 42 of the compressor 24. Accordingly, the fluid loop of the first portion R1 of the refrigeration fluid includes the compressor 24, condenser 26, main flow path of the economizer heat exchanger 32, expansion device 28, and the evaporator 30.

An economizer expansion device 44 may be arranged within the refrigeration circuit 22 in fluid communication with the condenser 26. The economizer expansion device 44 is operable to expand and cool the refrigeration fluid provided thereto. Although the economizer expansion device 44 is illustrated as being disposed within an economizer conduit 45 fluidly coupled to an extending from the main conduit 40 at a location upstream from the first inlet 36, it should be understood that an economizer conduit 45 fluidly connected to the outlet 34 of the condenser 26 in another suitable manner is also contemplated herein.

Located downstream from the economizer expansion device 44 is the inlet 46 of a second flow path of the economizer heat exchanger 32, also referred to herein as the "economizer flow path." Further, the outlet 48 of the second flow path of the economizer heat exchanger 32 may, but need not be directly connected to an economizer inlet or port 50 of the compressor 24. In the illustrated, non-limiting embodiment, the inlet 36 of the main flow path and the inlet 46 of the economizer flow path are arranged at adjacent sides of the economizer heat exchanger 32. However, in other embodiments, it should be understood that the inlets 36, 46 of both flow paths could alternatively be arranged at the same side of the economizer heat exchanger 32 or at opposite sides thereof. Similarly, the outlets 38, 48 of both the main flow path and the economizer flow path may be arranged at opposite sides, the same side, or adjacent sides depending on the desired flow configuration of the economizer heat exchanger 32. Further, although the economizer flow path is illustrated as a single pass, it should be understood that in some embodiments, the economizer flow path may include a plurality of passes through the economizer heat exchanger 32.

Within the economizer flow path, a second portion R2 of the refrigeration fluid is configured to absorb heat from the first portion R1 of the refrigeration fluid within the main flow path, thereby cooling the first portion R1 of the refrigeration fluid. As a result of this heat transfer, the second portion R2 of the refrigeration fluid within the economizer flow path may become a vapor. From the outlet 48 of the economizer flow path, the second portion R2 of the refrigeration fluid is provided to the economizer suction inlet 50 located at an intermediate portion of the compressor 24.

Accordingly, the second portion R2 of the refrigeration fluid bypasses the expansion device 28 and the evaporator 30 of the refrigeration circuit 22. Within the compressor 24 the first portion R1 and the second portion R2 of refrigeration fluid are mixed before being provided to the discharge port 52 to repeat the cycle. Accordingly, the fluid loop of the second portion R2 of the refrigeration fluid includes the compressor 24, condenser 26, economizer expansion device 44, and economizer flow path of the economizer heat exchanger 32. It should be understood that the refrigeration systems 20 illustrated and described herein are intended as an example only, and that a refrigeration system 20 having another configuration is within the scope of the disclosure.

With continued reference to both FIGS. 1 and 2, in an embodiment, the refrigeration system 20 includes at least one cooling system 60 for cooling one or more heat-generating devices 62. The term "heat-generating device" as used herein can refer to any electronic component which generates heat during operation thereof. Examples of a heat-generating devices 62 include, but are not limited to a processor, power electronic devices, or another device that can provide a controlled output power by modulating and/or converting a supplied input power (e.g., a variable frequency drive, power rectifier, power converter, and the like). Such a heat-generating device 62 can be used to control the speed of a compressor and/or the speed of a fan associated with of a refrigeration system based on various predetermined system conditions. In an embodiment, the at least one heat-generating devices 62 includes a variable frequency drive operably coupled to the compressor 24 of the refrigeration system 20.

Figure 3:
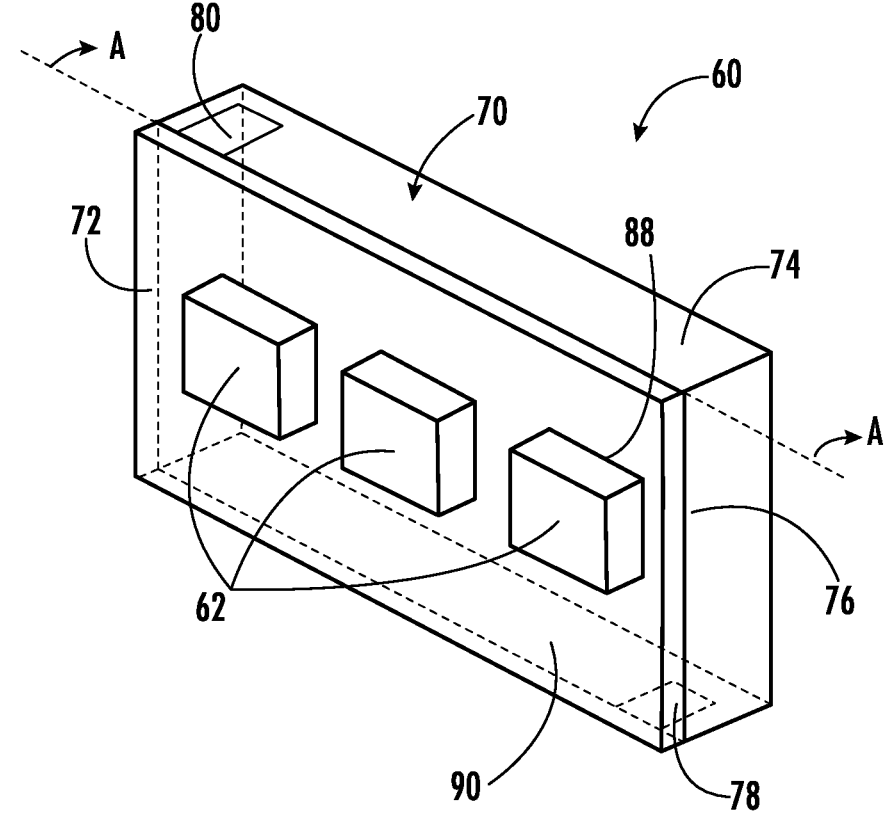
FIG. 3 is an illustration of an embodiment of a cooling system for cooling a heat-generating device according to an embodiment.

With reference now to FIG. 3, an example of at least a portion of a cooling system 60 for cooling one or more heat-generating devices 62 is illustrated. As shown, the cooling system 60 may include a heat sink having a housing 70 formed from a heat conductive material, such as a metal material. For example, the housing 70 may be formed from any suitable metal, e.g., aluminum, aluminum alloy, steel, steel alloy, copper, copper alloy, or the like. In the illustrated, non-limiting embodiment, the housing 70 is formed from a plurality of housing portions, such as a first housing portion 72, and a second housing portion 74, joined along corresponding mating surfaces to form a seam 76 therebetween. In such embodiments, the first and second housing portions 72, 74 can abut one another along a side and can be joined using any suitable means such as brazing, welding, clamping, compressing, bolting, and the like. Although two housing portions 72, 74 are illustrated in the exemplary embodiments, it should be understood that a housing 70 formed from any number of housing portions including a single housing portion, or more than two housing portions for example, are within the scope of the disclosure.

The mating surfaces of the first and second housing portions 72, 74 may be configured to correspond to one another, e.g., to fit together to seal a fluid circuit therebetween (the fluid circuit to be described in more detail below). In an embodiment, the mating surfaces of the first and second housing portions 72, 74 include precision surfaces formed from a process having highly accurate and precise dimensional control, such as through computer numerical control (CNC) machining process and/or net shape, or near net shape manufacturing process. Optionally a sealing material can be disposed between the first and second housing portions 72, 74 to aide in preventing leakage from the fluid circuit. As shown in FIG. 3, in an embodiment, each of the first housing portion 72 and the second housing portion 74 is formed as a substantially solid plate. However, embodiments where one or more of the housing portions 72, 74 has another configuration are also contemplated herein.

In an embodiment, a fluid circuit 77 (see FIG. 4) is formed within a portion of the housing 70, such as between the first and second housing portions 72, 74. In such embodiments, the heat sink may be considered a cold plate. The fluid circuit 77 includes a fluid inlet 78 and fluid outlet 80 formed in the housing 70. The fluid inlet 78 and the fluid outlet 80 can be any shape, including the shape of a circle, oval, triangular, square, rectangular, or any simple polygonal shape or portion thereof. Further, the perimeter of one or both of the fluid inlet 78 and the fluid outlet 80 can be formed by a recess in at least one or both of the housing portions 72, 74. The recess may extend to an edge of a respective housing portion, may be arranged centrally relative to a housing portion, or may overlap with the seam 76 defined between two adjacent housing portions 72, 74.

Figure 4:
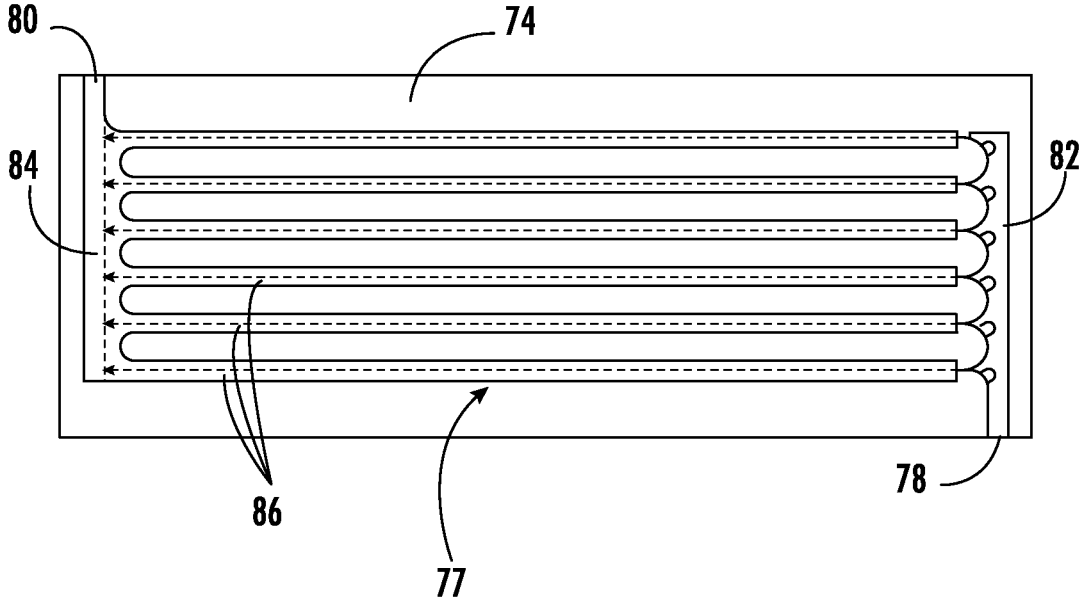
FIG. 4 is a cross-sectional view of the housing of the cooling system of FIG. 3 according to an embodiment.

An example of a fluid circuit 77 is best illustrated in the cross-sectional view of the heat sink shown in FIG. 4. In an embodiment, the fluid circuit 77 includes a single continuous flow path extending between and fluidly coupling the inlet 78 and the outlet 80. However, in other embodiments, as shown in the FIG., in addition to the inlet 78 and the outlet 80, the fluid circuit 77 may include a first or inlet manifold 82, a second or outlet manifold 84, and a plurality of fluid passages 86 connecting the first and second manifolds 82, 84. The fluid inlet 78 can be configured to connect a heat transfer fluid source to the inlet manifold 82 using any suitable mechanical connection. Similarly, the fluid outlet 80 can be configured to connect a heat transfer fluid sink to the outlet manifold 84 using any suitable mechanical connection (e.g., compression coupling, brazing, welding, and the like). In an embodiment, the heat transfer fluid configured to flow through the fluid circuit 77 is the refrigeration fluid circulating within the refrigeration circuit 22. For example, the heat transfer fluid source may be the condenser of the refrigeration system 20 and the heat transfer fluid sink may be the evaporator 30. However embodiments where the heat transfer fluid is separate from the refrigeration fluid of the refrigeration system 20 are also contemplated herein.

One or more of the inlet manifold 82, the outlet manifold 84, and the plurality of fluid passages 86 may be formed as a recess in at least one of the first housing portion 72 and the second housing portion 74. In an embodiment, the inlet manifold 82, the outlet manifold 84, and the plurality of fluid passages 86 are formed as a plurality of connected recesses in at least one housing portion, such as the second housing portion 74 for example. Accordingly, the plurality of recesses form the fluid circuit 77 disposed between the first and second housing portions 72, 74 when the housing portions 72, 74 are joined. For example, a first housing portion 72 having a plurality of connected recesses can be joined to a flat, second housing portion 74 that does not have any recesses formed therein. In another embodiment, a first housing portion 72 and a second housing portion 74 can each have a plurality of connected recesses which mirror one another such that when the first and second housing portions 72, 74 are joined, the connected recesses form the fluid circuit 77. The plurality of connected recesses can have any shape in the depth dimension (e.g., as projected into the plate), including semi-circular, semi-oval, triangular, square, rectangular, or any simple polygonal shape or portion thereof.

The mating surfaces of the first and second housing portions 72, 74 can substantially border the plurality of connected recesses. Optionally, the mating surfaces can include raised or recessed portions, or other engagement features to aid in alignment of the housing portions 72, 74 prior to joining. However, it should be appreciated that embodiments where the heat sink does not include a fluid circuit extending therethrough or formed therein are also within the scope of the disclosure.

With reference again to FIG. 3, the one or more heat-generating devices 62 to be cooled by the cooling system 60 may be mounted directly or indirectly to a surface 90 of the housing 70 of the heat sink, such as of the first housing portion 72 for example. The at least one heat-generating device 62 may be mounted to the housing 70 in any suitable manner that facilitates the transfer of thermal energy from the heat-generating device 62 to the housing 70. Because electrical components inside the heat-generating device 62 can generate a large amount of heat, each heat-generating device 62 may have an interface 88 which is designed for attachment to the heat sink. In an embodiment, a thermal interface material (not shown) is arranged between the heat sink interface 88 and the adjacent surface 90 of the housing 70 of the heat sink to facilitate the transfer of heat from the at least one heat-generating device 62 to the heat sink. When the heat-generating devices 62 are thermally coupled to the cooling system 60, the heat generated by the heat-generating devices 62 is at least partially transferred to the heat sink of the cooling system 60 via the heat sink interface 88 to keep the one or more heat-generating devices 62 cooled below a maximum allowable operating temperature (e.g., 150° C.).

In embodiments where the heat sink is a cold plate, one or more fluid passages 86 of the fluid circuit 77 may be positioned to perform localized cooling at the area of the housing 70 with the greatest heat flux, such as at the area directly aligned with or in overlapping arrangement with a heat-generating device 62. Accordingly, the at least one fluid passage 86 may be associated with a heat-generating device 62. In embodiments where the housing 70 is associated with a plurality of heat-generating devices 62, one or more fluid passages 86 may be associated with and configured to remove heat from a respective heat-generating device 62. More specifically, the at least one fluid passage 86 associated with a respective heat-generating device 62 may be physically located within the housing 70 in alignment with the heat-generating device 62.

Figure 5:
FIG. 5 is front view of a cooling system according to another embodiment.

With reference now to FIG. 5, in an embodiment, the cooling system 60 additionally includes a heat exchanger 100 mounted in an axially overlapping relationship with and thermally coupled to the at least one heat-generating device 62. Although only a single heat exchanger 100 is illustrated in the FIGS., it should be appreciated that a plurality of heat exchangers may be included to increase the heat transfer that occurs therein. In an embodiment, the heat exchanger 100 is thermally coupled to heat sink, such as to a second surface 92 of the housing 70 thereof. Although the heat exchanger 100 is illustrated as being located opposite the at least one heat-generating device 62 about the housing 70, embodiments where the heat exchanger 100 is thermally coupled to a side of the housing 70 located adjacent to the side at which the at least one heat-generating device 62 is mounted are also contemplated herein.

Figure 6:
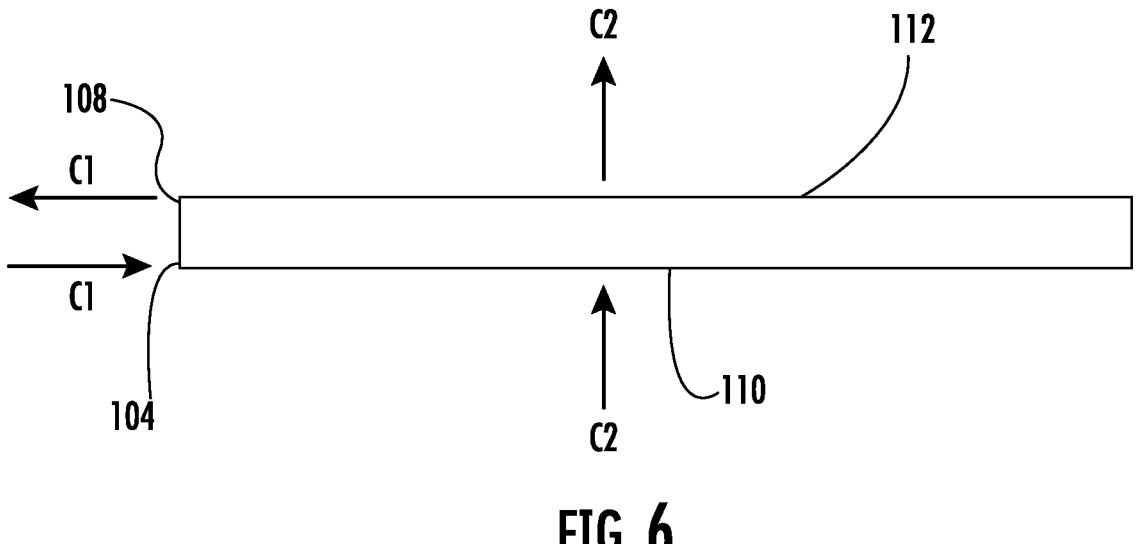
FIG. 6 is a plan view of the heat exchanger of the cooling system of FIG. 5 according to an embodiment.

In the illustrated, non-limiting embodiment, an inlet conduit 102 is fluidly connected to a first fluid inlet 104 of the heat exchanger 100 and an outlet conduit 106 is fluidly connected to a first fluid outlet 108 of the heat exchanger 100 to form a flow path of a primary cooling fluid C1. The heat exchanger additionally includes a second fluid inlet 110 (see FIG. 6) connected to a second fluid outlet 112 to define a flow path of a secondary cooling fluid C2. In embodiments where the housing 70 is a cold plate, the primary cooling fluid C1 and/or the secondary cooling fluid C2, may be the same or may be distinct or different from the heat transfer fluid provided to the fluid circuit 77.

In an embodiment, the body of the heat exchanger 100 includes an inlet manifold 114 defining the first fluid inlet 104 and an outlet manifold 116 defining the first fluid outlet 108. The inlet manifold 114 and the outlet manifold 116 are fluidly connected via at least one, and in some embodiments, a plurality of heat exchanger tubes 118. In an embodiment, the inlet manifold 114 is positioned directly adjacent to the surface 92 of the heat sink and is thermally coupled thereto via a thermal interface material 120.

The heat exchanger 100 may be a microchannel heat exchanger having a plurality of substantially parallel micro-channel heat exchange tubes 118 (see FIG. 6), each defining a plurality of fluid flow paths (not shown). However, examples of other types of heat exchangers that may be used, include, but are not limited to, microtube, double pipe, shell and tube, tube and fin, plate, plate and shell, adiabatic shell, plate fin, pillow plate, and fluid heat exchangers. The type of heat exchanger 100 selected may depend at least in part based on the type of primary and secondary cooling fluids C1, C2 being provided thereto.

In the illustrated, non-limiting embodiment of FIG. 5, the cooling system 60 includes a single heat exchanger 100 associated with each of the three illustrated heat-generating devices 62. However, in other embodiments, a distinct heat exchanger 100 may be associated with each heat-generating devices 62. In such embodiments, the primary cooling fluid C1 may be configured to flow through each of the plurality of heat exchangers in parallel or in series.

The primary cooling fluid C1 and the secondary cooling fluid C2 are arranged in a heat exchange relationship at the heat exchanger 100. In an embodiment, the heat exchanger 100 is configured as an evaporator and the primary cooling fluid C1 provided to heat exchanger 100 is configured to absorb heat from the secondary cooling fluid C2. In the illustrated, non-limiting embodiment, the secondary cooling fluid C2 is a flow of air moved by a fan 130. However, in other embodiments, another movement mechanism, such as a pump or some other component may be used to circulate the secondary cooling fluid C2 through the heat exchanger and across the peripheral heat-generating devices. Further, it should be understood that any fluid, including a liquid, may be used as the secondary cooling fluid. In the non-limiting embodiment illustrated in FIG. 5, the heat exchanger 100 has a single pass configuration for both the primary cooling fluid C1 and the secondary cooling fluid C2. However, in other embodiments, at least one of the primary and secondary cooling fluids C1, C2 may make multiple passes through the heat exchanger 100. Further, the primary and secondary cooling fluids C1, C2 may be arranged in any suitable flow configuration at the heat exchanger, such as a cross-flow, a parallel flow, a counter-flow, or any combination thereof.

In operation, the method of cooling the at least on heat-generating device includes transferring heat from the at least one heat-generating device to the heat sink. The method additionally includes providing the primary cooling fluid C1, such as a refrigeration fluid or refrigerant for example, from the inlet conduit 102 into the inlet manifold 114 of the heat exchanger 100. The primary cooling fluid C1 provided to the inlet manifold 114 may be a liquid, or alternatively, may be a two-phase mixture of liquid and vapor. Within the inlet manifold 114, at least a portion of the heat transferred to the heat sink from the at least one heat-generating device 62 is transferred from the second surface 92 of the housing 70 of the heat sink to the primary cooling fluid C1. The heat transferred to the primary cooling fluid C1 within the inlet manifold 114 causes the temperature of the primary cooling fluid C1 to increase, and in some embodiments, causes at least a portion of the primary cooling fluid C1 within the inlet manifold 114 to vaporize.

In an embodiment, a surface 122 of the heat exchanger 100, such as a surface of the inlet manifold 114 located adjacent to the surface 92 of the heat sink for example, is optimized to facilitate boiling, such as nucleate boiling for example, of the primary cooling fluid C1 within the inlet manifold 114. This optimization may include the formation of a specific microstructure at the surface 122. In an embodiment, this optimization is performed via application a coating or film applied to the surface 122. Alternatively, this optimization may be performed via a machining process or another suitable manufacturing process. However, it should be appreciated that the enhanced or optimized surface 122 intended to facilitate boiling of the primary cooling fluid C1 is not required, and in some embodiments is not present within heat exchanger 100.

As the primary cooling fluid C1 vaporizes, the gaseous primary cooling fluid having some liquid primary cooling fluid entrained therein flows through the plurality of heat exchange tubes 118 of the heat exchanger 100 toward the outlet manifold 116 of the heat exchanger 100. In the illustrated, non-limiting embodiment, the secondary cooling fluid C2 is configured to flow through the gaps or passages 124 defined between adjacent heat exchange tubes 118. As the secondary cooling fluid moves through the plurality of passages 124, heat from the secondary cooling fluid C2 is transferred to the primary cooling fluid C1, causing at least some of the liquid primary cooling fluid C1 within the heat exchange tubes 118 to vaporize.

In an embodiment, the movement mechanism 130 operable to move the secondary cooling fluid C2 through the heat exchanger 100 includes a fan 31 associated with the condenser 26 of the refrigeration system, and the secondary cooling fluid C2 is the flow of air exhausted from the condenser 26. However, it should be understood that the fan may be associated with another component of the refrigeration system 20, or alternatively, may be dedicated solely to the movement of the secondary cooling fluid C2 through the heat exchanger 100. Further, it should be understood that any fluid, including a liquid, may be used as the secondary cooling fluid. For example, the secondary cooling fluid C2 may be a liquid or a two-phase fluid. Further, it should be appreciated that in embodiments where a liquid is used as the secondary cooling fluid C2, use of a heat exchanger having another configuration may be required.

The heated primary cooling fluid C1 received within the outlet manifold 116 and output from the first fluid outlet 108 of the heat exchanger 100 may include a greater amount of vapor than the primary cooling fluid C1 provided to the first fluid inlet 104 of the heat exchanger 100. In an embodiment, the primary cooling fluid C1 provided to the first fluid outlet 108 of the heat exchanger is primarily vapor, if not entirely vapor. In embodiments where the heated primary cooling fluid C1 is the refrigeration fluid of the refrigeration system 20, the primary cooling fluid C1 output from the first fluid outlet 108 may be delivered to another component of the refrigeration system 20. The cooled secondary cooling fluid C2 provided at the second fluid outlet 112 of the heat exchanger 100 may be exhausted out of the cooling system 60 and/or may be used to cool another heat-generating device 62 or other component within the refrigeration system 20. For example, the cooled secondary cooling fluid C2 may be used to absorb heat from the refrigeration fluid at the condenser 26.

As best shown in FIG. 5, at least one valve V may be arranged within the inlet conduit 102 and/or the outlet conduit 106 to control the flow of the primary cooling fluid C1 to and/or from the heat exchanger 100. In an embodiment, the position of the valve V and therefore the flow through the heat exchanger 100, is actively managed based on a thermal load at the heat exchanger 100. The thermal load may be determined on information collected by one or more sensors, represented schematically at T. In the illustrated, non-limiting embodiment, a first sensor is operable to monitor the temperature of the heat sink, and a second sensor is operable to monitor the temperature of the primary cooling fluid C1 at the outlet conduit 106. It should be appreciated that the at least one sensor T may be operable to measure temperature directly or indirectly. Further, the at least one sensor may be configured to monitor another parameter, such as humidity for example. In an embodiment, the valve V is operated to control the temperature of at least one of the primary and secondary cooling fluids C1, C2 output from the heat exchanger 100 to prevent the formation of condensation on the exterior surface of the heat exchange tubes 118.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A cooling system for cooling one or more heat-generating devices, comprising:
   a heat sink to which the one or more heat-generating devices are thermally coupled, the heat sink including a housing and a fluid circuit formed in the housing and through which a heat transfer fluid circulates; and
   a heat exchanger thermally coupled to the heat sink, the heat exchanger having a first flow path for receiving a primary cooling fluid and a second flow path for receiving a secondary cooling fluid, wherein heat is transferable to the primary cooling fluid from both the heat sink and the secondary cooling fluid at the heat exchanger.

2. The cooling system of claim 1, further comprising a movement mechanism operable to move the secondary cooling fluid through the second flow path.

3. The cooling system of claim 2, wherein the movement mechanism includes a fan associated with a condenser of a refrigeration system.

4. The cooling system of claim 1, wherein the heat exchanger further comprises an inlet manifold, the inlet manifold being positioned adjacent to the heat sink.

5. The cooling system of claim 4, wherein a surface of the inlet manifold has a microstructure, the microstructure being optimized to facilitate boiling of the primary cooling fluid within the inlet manifold.

6. The cooling system of claim 1, wherein the heat exchanger is a microchannel heat exchanger.

7. The cooling system of claim 1, wherein the heat transfer fluid is different than at least one of the primary cooling fluid and the secondary cooling fluid.

8. The cooling system of claim 1, wherein at least one of the heat transfer fluid and the primary cooling fluid is a refrigeration fluid diverted from a condenser of a refrigeration system.

9. The cooling system of claim 1, further comprising at least one valve operable to actively control a flow of the primary cooling fluid provided to the heat exchanger based on a thermal load at the heat exchanger.

10. The cooling system of claim 9, further comprising at least one sensor for monitoring the thermal load at the heat exchanger.

11. The cooling system of claim 10, wherein the at least one sensor is operable to monitor at least one of a temperature of the primary cooling fluid at an outlet of the heat exchanger and a temperature of the heat sink.

12. The cooling system of claim 9, wherein the at least one valve is operable to actively control a flow of the primary cooling fluid to prevent condensation from forming at an exterior of the heat exchanger.

13. A method of cooling at least one heat-generating device, the method comprising:

transferring heat from a heat sink to a primary cooling fluid at a heat exchanger, the heat exchanger being mounted to the heat sink;

actively controlling a flow of the primary cooling fluid provided to the heat exchanger based on a thermal load at the heat exchanger; and transferring heat from a secondary cooling fluid to the primary cooling fluid at the heat exchanger.

14. The method of cooling of claim 13, further comprising transferring heat from the at least one heat-generating device to the heat sink.

15. The method of cooling of claim 13, wherein the heat exchanger includes an inlet manifold, the inlet manifold being mounted adjacent to the heat sink, and transferring heat from the heat sink to the primary cooling fluid at the heat exchanger further comprises transferring heat from the heat sink to the primary cooling fluid within the inlet manifold.

16. The method of cooling of claim 13, further comprising providing the secondary cooling fluid to the heat exchanger via a movement mechanism.

17. The method of cooling of claim 16, wherein the movement mechanism includes a fan associated with a condenser of a refrigeration system.

18. The method of cooling of claim 13, further comprising determining the thermal load at the heat exchanger using information collected by one or more sensors.

19. A cooling system for cooling one or more heat-generating devices, comprising:

a heat sink to which the one or more heat-generating devices are thermally coupled;

a heat exchanger thermally coupled to the heat sink, the heat exchanger having an inlet manifold, a first flow path for receiving a primary cooling fluid and a second flow path for receiving a secondary cooling fluid, wherein heat is transferable to the primary cooling fluid from both the heat sink and the secondary cooling fluid at the heat exchanger; and wherein the inlet manifold is positioned adjacent to the heat sink and a surface of the inlet manifold has a microstructure optimized to facilitate boiling of the primary cooling fluid within the inlet manifold.

20. A cooling system for cooling one or more heat-generating devices, comprising:

a heat sink to which the one or more heat-generating devices are thermally coupled;

a heat exchanger thermally coupled to the heat sink, the heat exchanger having a first flow path for receiving a primary cooling fluid and a second flow path for receiving a secondary cooling fluid, wherein heat is transferable to the primary cooling fluid from both the heat sink and the secondary cooling fluid at the heat exchanger; and at least one valve operable to actively control a flow of the primary cooling fluid provided to the heat exchanger based on a thermal load at the heat exchanger.

* * * * *